(12) United States Patent
Mehta et al.

(10) Patent No.: US 6,846,714 B1
(45) Date of Patent: Jan. 25, 2005

(54) VOLTAGE LIMITED EEPROM DEVICE AND PROCESS FOR FABRICATING THE DEVICE

(75) Inventors: Sunil D. Mehta, San Jose, CA (US); Kerry Ilgenstein, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 7 days.

(21) Appl. No.: 10/263,507

(22) Filed: Oct. 3, 2002

(51) Int. Cl.$^7$ .................. H01L 21/336; H01L 21/8247
(52) U.S. Cl. ................ 438/264; 438/981; 438/594
(58) Field of Search .................. 438/257, 258, 438/264, 275, 593, 594, 241, 981

(56) References Cited

U.S. PATENT DOCUMENTS

| | | | | |
|---|---|---|---|---|
| 5,296,393 A | * | 3/1994 | Smayling et al. | 438/275 |
| 5,362,685 A | * | 11/1994 | Gardner et al. | 438/211 |
| 5,595,922 A | * | 1/1997 | Tigelaar et al. | 438/587 |
| 5,637,520 A | * | 6/1997 | Cappelletti et al. | 438/258 |
| 5,672,521 A | | 9/1997 | Barsan et al. | |
| 5,834,352 A | * | 11/1998 | Choi | 438/275 |
| 5,861,347 A | * | 1/1999 | Maiti et al. | 438/787 |
| 5,942,780 A | | 8/1999 | Barsan et al. | |
| 5,970,345 A | * | 10/1999 | Hattangady et al. | 438/279 |
| 6,147,008 A | * | 11/2000 | Chwa et al. | 438/762 |
| 6,162,683 A | * | 12/2000 | Chen | 438/258 |
| 6,184,093 B1 | * | 2/2001 | Sung | 438/275 |
| 6,197,638 B1 | * | 3/2001 | Mehta | 438/258 |
| 6,208,559 B1 | | 3/2001 | Tu et al. | |
| 6,255,169 B1 | | 7/2001 | Li et al. | |
| 6,331,492 B2 | * | 12/2001 | Misium et al. | 438/762 |
| 6,410,387 B1 | * | 6/2002 | Cappelletti et al. | 438/257 |
| 6,429,073 B1 | * | 8/2002 | Furuhata et al. | 438/258 |
| 6,569,742 B1 | * | 5/2003 | Taniguchi et al. | 438/303 |
| 6,576,512 B2 | * | 6/2003 | Taniguchi et al. | 438/257 |

* cited by examiner

*Primary Examiner*—M. Wilczewski
(74) *Attorney, Agent, or Firm*—Brinks Hofer Gilson & Lione

(57) ABSTRACT

An EEPROM device having voltage limiting charge pumping circuitry includes charge pumping circuitry that limits the voltage supplied to the high voltage transistors to levels below the breakdown field of the tunnel oxide layer. The EEPROM device includes a substrate having a programming region, a tunnel region, a sensing region, and a low voltage region. A first oxide layer having a first thickness overlies the tunnel region and the sensing region. A second oxide layer having a second thickness overlies the low voltage region. The first oxide thickness is greater than the second oxide thickness. A charge pumping circuit is coupled to the programming region and to the tunnel region. The charge pumping circuit impresses a voltage level across the first oxide layer that is below the field breakdown voltage of first oxide layer. A process for fabricating the device is also provided.

13 Claims, 12 Drawing Sheets

VOLTAGE LIMITED EEPROM DEVICE AND PROCESS FOR FABRICATING THE DEVICE

TECHNICAL FIELD

The present invention relates, in general, to electrically-erasable-programmable-read-only-memory (EEPROM) devices and, more particularly, to EEPROM device architecture and charge pumping circuitry and to a process for fabricating the device.

BACKGROUND

Non-volatile memory devices are both electrically erasable and programmable. Such devices retain data even after the power to the device is terminated. One particular type of non-volatile memory device is the (electrically-erasable-programmable-read-only-memory) EEPROM device. In an EEPROM device, programming and erasing is accomplished by transferring electrons to and from a floating-gate electrode through a thin dielectric layer, known as a tunnel-oxide layer, located between the floating-gate electrode and the underlying substrate. Typically, the electron transfer is carried out either by hot electron injection, or by Fowler-Nordheim tunneling. In either electron transfer mechanism, a voltage is coupled to the floating-gate electrode by a control-gate electrode, which can be a region in a substrate known as a programming region. The control-gate electrode or programming region is capacitively coupled to the floating-gate electrode, such that a voltage applied to the programming region is coupled to the floating-gate electrode.

Single poly EEPROM cells are extensively used in programmable logic devices (PLDs). EEPROM cells used in PLDs can have a two transistor design or a three transistor design. A three transistor EEPROM cell, for example, includes a write transistor, a read transistor, and a floating-gate (or sense) transistor. In a two transistor device, the functions of floating-gate and sense transistors are combined into a single transistor.

To program PLD EEPROMs, a high voltage Vpp+ is applied to the gate electrode of the write transistor and a relatively lower voltage Vpp is applied to the drain (bit line contact) of the write transistor. The voltage applied to the write transistor gate electrode turns the write transistor on allowing the voltage applied to the bit line to be transferred to the source of the write transistor. Electrons on the floating-gate electrode are drawn from the floating-gate electrode across a tunnel oxide layer to the source of the write transistor, leaving the floating-gate electrode at a high positive potential. The application of such high voltage levels is a write condition that results in a net positive charge being stored in the EEPROM cell.

To erase the EEPROM cell, a voltage Vcc is applied to the gate of the write transistor and ground potential is applied to the bit line and a high voltage Vpp+ is applied to the programming region. Under this bias condition, the high voltage applied to programming region is coupled to the floating-gate electrode and the EEPROM cell is erased by the transfer of electrons from the substrate across the tunnel oxide layer to the floating-gate electrode.

The efficient application of high voltage to the write transistor and sense transistor during program and erase cycles requires that the gate dielectric layers of these transistor have a similar thickness to the dielectric layer separating the program junction regions (which comprise a tunnel region and a programming region in the substrate) from the overlying floating-gate electrode. High voltage circuit elements, such as program transistors and sense transistors, are usually formed on a wafer substrate with a relatively thick gate oxide layer. Such relatively thick gate oxide layers are usually required to prevent transistor circuit breakdown in such a high voltage operating environment. On the other hand, it is preferable that the low voltage circuitry, such as read transistors, be fabricated with relatively thin gate oxide layers on the substrate. Such thin gate oxide layers typically increase the speed of such circuit elements. For example, transistor elements having relatively short gate lengths and thin oxide layers typically provide increased operating speeds.

As process technologies evolve toward shorter and shorter gate lengths it is desirable to reduce the thickness of the gate oxide layer even further in order to achieve greater operating speed. Some circuit elements, however, may not be scalable. For example, because of significant endurance and data retention problems, tunnel oxide layers usually cannot be scaled down in thickness in the same manner as low voltage oxide layers. Such tunnel oxide layers may be thinner than high voltage oxide layers on the wafer substrate. Therefore, non-volatile memories can usually benefit from the formation of at least three differing oxide thicknesses on the same substrate. Accordingly, transistors with relatively thick oxide layers can accommodate high voltage program and erase operations, while read transistors and logic transistors, with relatively thin oxide layers, can operate at high speed with relatively thin gate oxides.

The fabrication of three separate oxide thickness requires several processing steps and increases the cost of manufacturing the device. Accordingly, EEPROM devices and, in particular, PLDs will benefit from a design strategy that eliminates the need for the fabrication of three separate oxide layers.

SUMMARY

The present invention provides an EEPROM device having voltage limiting charge pumping circuitry and a process for fabricating the device. The charge pumping circuitry limits the voltage supplied to the high voltage transistors to levels below the breakdown field of the tunnel oxide layer. By limiting the voltage impressed on the high voltage transistors to levels below the breakdown field of the tunnel oxide layer, it is not necessary to fabricate a special oxide layer for the high voltage transistors. Accordingly, the same oxidation cycle can be used to fabricate the tunnel oxide layer and the high voltage oxide layer. Thus, only two oxidation steps are necessary to fabricate the gate oxide layers for active elements of the device: one for the low voltage transistors, and one for the tunnel oxide layer and high voltage transistors and the programming region.

In one aspect, the EEPROM device includes a substrate having a programming region, a tunnel region, a sensing region, and a low voltage region. A first oxide layer having a first thickness overlies the tunnel region and the sensing region. A second oxide layer having a second thickness overlies the low voltage region. The first oxide thickness is greater than the second oxide thickness. A charge pumping circuit is coupled to the programming region and to the tunnel region. The charge pumping circuit impresses a voltage of no more than the field breakdown voltage across the first layer.

The charge pumping circuit includes a pumping source in which the pumping source boosts an input voltage to a first intermediate voltage. A pumping stack is electrically coupled to the pumping source. The pumping stack boosts the first intermediate voltage to a programming voltage.

With respect to the transistors in an EEPROM memory array, the circuitry operates, such that during programming, a supply voltage, usually about 12 volts, is applied to the gate electrodes and about 11.35 volts is applied to bit line contacts of selected memory cells. For an unselected memory cell, during programming, either the gate electrode or the bit line contact, or both, will be maintained at about 4.1 volts. Accordingly, the full supply voltage (12 volts or more) is never impressed across a gate oxide layer of any transistor in the memory array.

In another aspect, a process is provided that includes providing a substrate having a programming region, a tunnel region, a sensing region, and a low voltage region. A first oxide layer having a first thickness is formed on the programming region, the tunnel region, and the sensing region. A second oxide layer having a second thickness is formed on the low voltage region, where the first thickness is greater than the second thickness. In operation of the device, a voltage applied to the tunnel region is limited to voltage levels below the field breakdown of the first oxide layer.

In a further aspect of the invention, the doping concentration of the tunnel region is limited to reduce the doping-enhanced oxidation rate. By limiting the doping concentration in the tunnel region, the tunnel oxide layer thickness can be fabricated to be similar to the high voltage gate oxide thickness.

Figure 1:
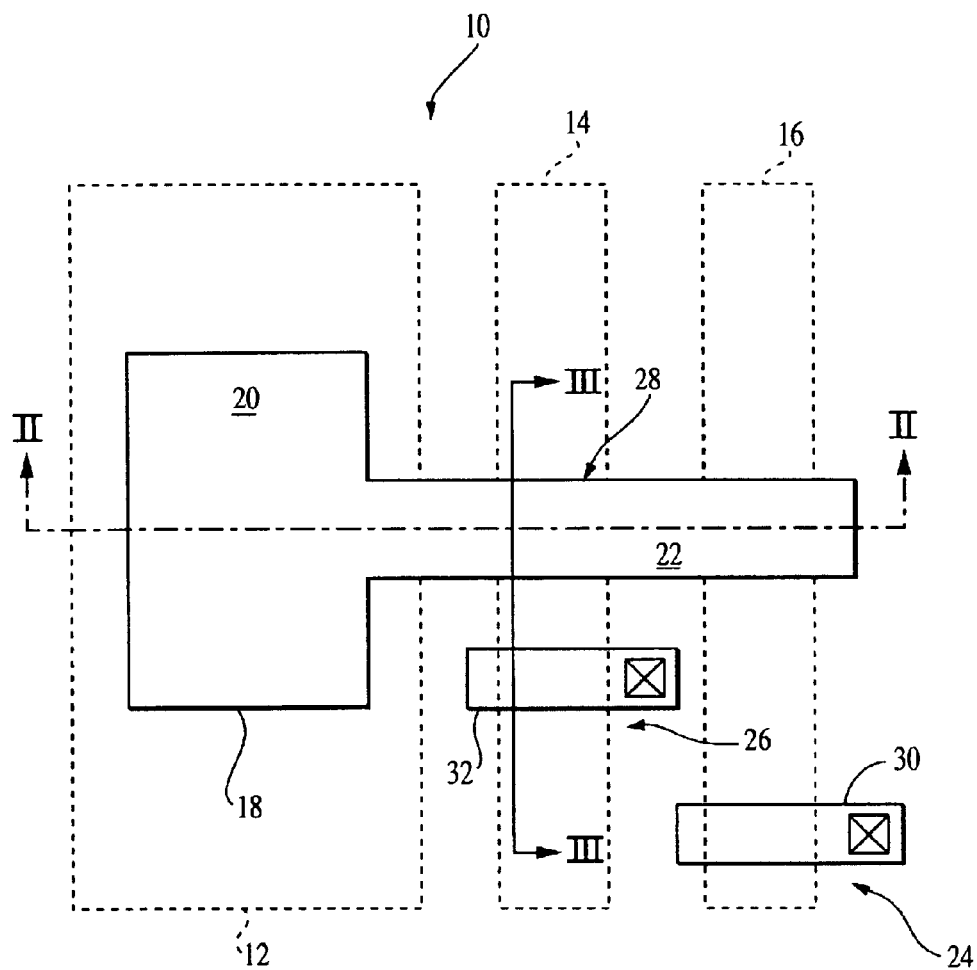
FIG. 1 illustrates a top view of an EEPROM device arranged in accordance with one embodiment of the invention.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

A top view of an EEPROM device 10 arranged in accordance with one embodiment of the invention is illustrated in FIG. 1. EEPROM device 10 includes three active substrate regions, a programming region 12, a sensing region 14, and a tunnel region 16. A floating-gate electrode 18 includes a capacitor portion 20 overlying programming region 12 and a gate portion 22 overlying sensing region 14 and tunnel region 16. Device 10 also includes a write transistor 24, a read transistor 26, and a sense transistor 28. Write transistor 24 is formed where a gate electrode 30 overlies tunnel region 16. Read transistor 26 is formed where a gate electrode 32 overlies sensing region 14 and sense transistor 28 is formed where gate portion 22 overlies sensing region 14. Electrons are transferred to and from floating-gate electrode 18 where gate portion 22 overlies tunnel region 16.

Those skilled in the art will recognize that numerous variations are possible for the component arrangement in an EEPROM device. Accordingly, the particular arrangement illustrated in FIG. 1 is but one of many possible arrangements for a 3-transistor EEPROM device.

Figure 2:
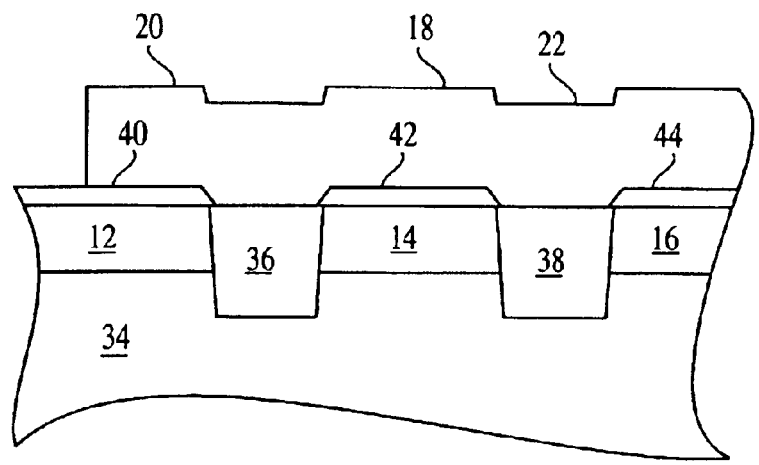
FIG. 2 illustrates a cross sectional view of the device illustrated in FIG. 1 taken along section line II—II.

FIG. 2 illustrates a cross sectional view of device 10 taken along section line II—II of FIG. 1. In one embodiment of the invention, device 10 is fabricated in a P-type silicon substrate 34. The present invention, however, is not limited to the fabrication of EEPROM device 10 in a P-type substrate. Those skilled in the art will appreciate that an EEPROM device can be fabricated on other substrates, such as an N-type substrate. Additionally, substrate 34 can be an epitaxial layer, such as epitaxial silicon, a silicon-on-insulator (SOI) substrate, and the like.

Semiconductor substrate 34 includes isolation regions 36 and 38. Sensing region 14 resides between isolations 36 and 38. In a preferred embodiment, isolation regions 36 and 38 are trench isolation regions fabricating by first etching recessed regions in semiconductor substrate 34, followed by filling the recessed regions with an insulating material, such as silicon oxide. Although trench isolation regions are illustrated, those skilled in the art will recognize that other isolation techniques can be used, such as localized-oxidation-of-silicon (LOCOS), and the like, can also be used.

Depending upon the particular conductivity of the transistors to be fabricated, sensing region 14 can be either an N-type or a P-type region. In the present embodiment, sensing region 14 is formed by introducing P-type dopants into semiconductor substrate 34. Preferably, programming region 12 and tunnel region 16 are formed by introducing an N-type dopant, such as phosphorous or arsenic, or a combination of phosphorous and arsenic into semiconductor substrate 34. Preferably, programming region 12 and tunnel region 16 have a doping concentration of about 1E17 atoms/cm3 to about 5E19 atoms/cm3 and are formed by ion implanting an N-type dopant using a dose of about 5E 13 ions/cm$^2$ to about 5 $\mu$l 5 ions/cm$^2$. In accordance with the invention, the doping concentration used to form programming region 12 and tunnel region 16 is such that oxide layers grown over these regions have substantially the same thickness.

As will subsequently be described, dielectric layers are fabricated overlying the various regions of semiconductor substrate 34. A capacitor oxide layer 40 overlies programming region 12, a sense gate oxide layer 42 overlies sensing region 14, and a tunnel oxide layer 44 overlies tunnel region 40. Capacitor portion 20 of floating-gate electrode 18 is separated from programming region 12 by capacitor dielectric layer 40. Similarly, gate portion 22 of floating-gate electrode 18 is separated from sensing region 14 by sense gate oxide layer 42 and from tunnel region 16 by tunnel oxide layer 44. In accordance with the invention, layers 40, 42 and 44 are simultaneously fabricated and all have substantially the same thickness. Preferably, oxide layers 40, 42, and 44 have a thickness of about 90 angstroms to about 100 angstroms. Slight differences in thickness exist, however, in view of different oxidation rates caused by doping concentration levels in the underlying substrate regions.

Figure 3:
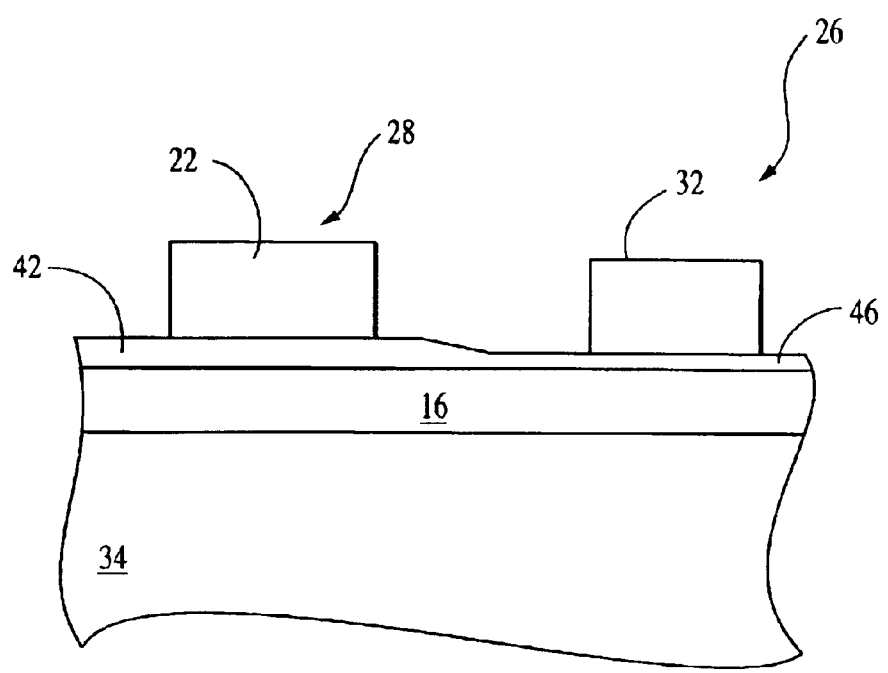
FIG. 3 illustrates a cross sectional view of the device illustrated in FIG. 1 taken along section line III—III.

FIG. 3 illustrates a cross sectional view of device 10 taken along section line III—III of FIG. 1. Since read transistor 26 is a low voltage transistor, gate electrode 32 overlies a relatively thin gate oxide layer 46. Gate oxide layer 46 has a thickness of preferably about 20 angstroms to about 60 angstroms and, most preferably, about 35 angstroms. By fabricating a relatively thin gate oxide layer for read transistor 26, it and other logic transistors (not shown) can benefit from high speed operation obtained through the short gate length and thin gate oxide layers. Correspondingly, the relatively thick sense gate oxide layer 42 of sense transistor 28 allows for the high voltage operation necessary to program and erase EEPROM device 10.

Figure 4:
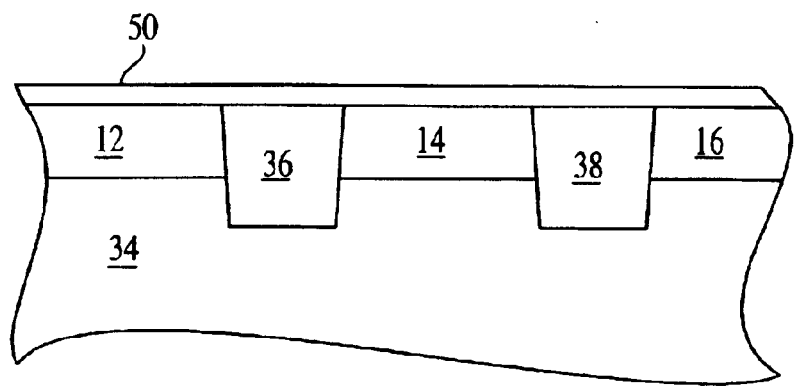
FIGS. 4–7, illustrate, in cross-section, processing steps in accordance with the invention.

To fabricate the oxide layers for EEPROM device 10, an oxidation process is carried out to form an initial oxide layer 50 on semiconductor substrate 34, as illustrated in FIG. 4. Initial oxide layer 50 is preferably fabricated by thermally oxidizing semiconductor substrate 34 to form a silicon dioxide layer having a thickness of about 70 angstroms to about 90 angstroms.

Figure 5:
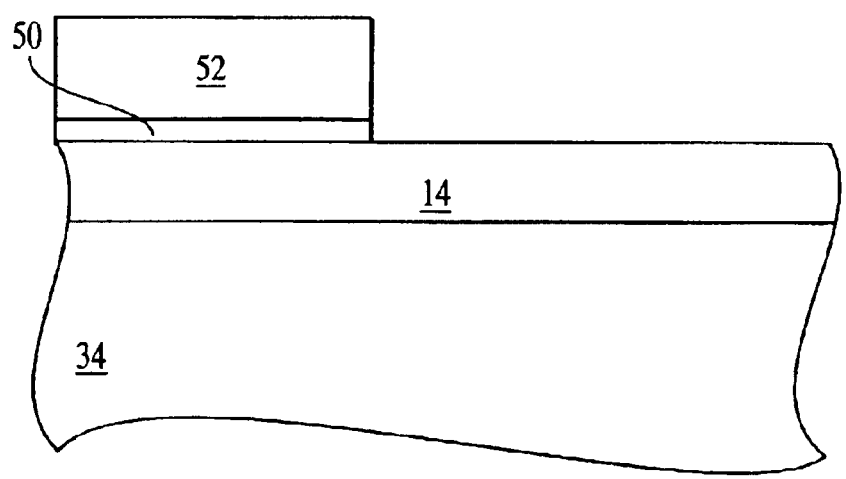

Next, as illustrated in FIG. 5, a lithographic mask 52 is formed to overlie the high voltage regions and to expose the low voltage regions of semiconductor substrate 34. Then, an oxide etching process is carried out to etch away portions of initial oxide layer 50 exposed by lithographic mask 52. The etching process removes substantially all of initial oxide layer 50 in low voltage regions, such as the portion of sense region 16 in which read transistor 26 resides.

Figure 6:
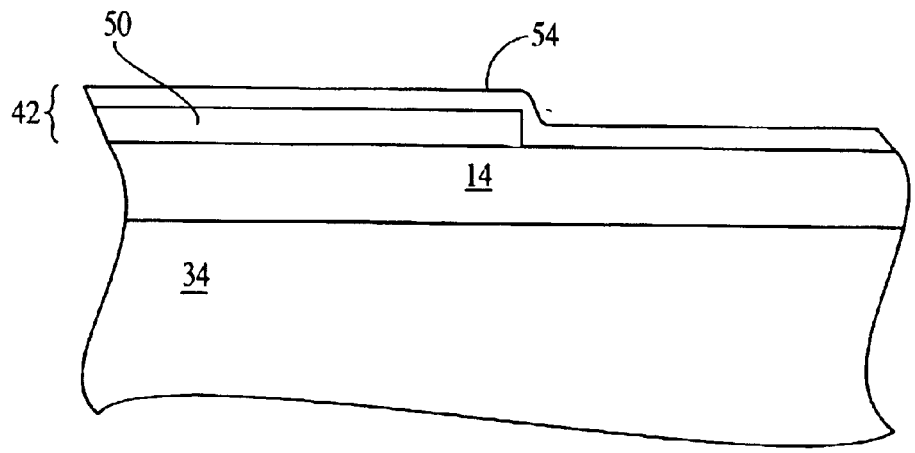
Figure 7:
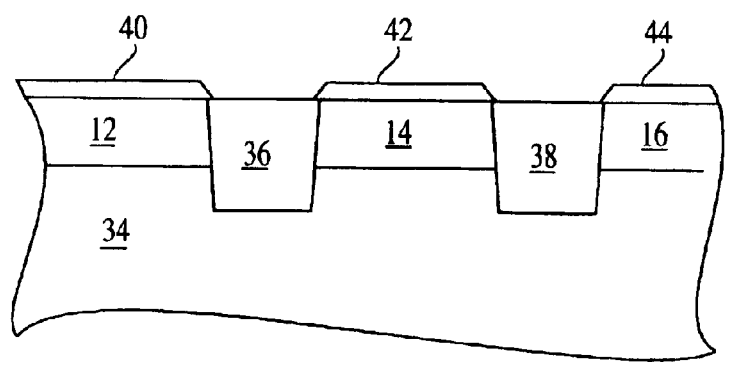

After removing exposed portions of initial oxide layer 50, another oxidation process is carried out to form a second oxide layer 54, as illustrated in FIG. 6. The second oxidation process forms a silicon dioxide layer having a thickness of about 30 angstroms to about 40 angstroms on the low voltage regions of semiconductor substrate 34. Additionally, the second oxidation process thickens remaining portions of initial oxide layer 50. Accordingly, as illustrated in FIG. 7, oxide layers overlying high voltage regions, such as sense gate oxide layer 42, and capacitor oxide layer 40 and tunnel oxide layer 44 have a relatively thick oxide layer formed by two sequential oxidation processes. Although the oxidation process is illustrated in FIG. 6 as forming two separate oxide layers for clarity, those skilled in the art will recognize that, in an actual sequential oxidation process, sense gate oxide layer 42 is one continuous oxide layer without a distinct interface between two oxide layers. Also, the actual oxidation processes take place at the silicon surface. Accordingly, second oxide layer 54 initially forms at the surface of substrate 34.

One solution to the problem of high voltage processing in EEPROM devices is disclosed in commonly-assigned U.S. Pat. No. 6,208,559, the disclosure of which is incorporated by reference herein. This patent discloses an operating method that reduces the voltage impressed across the gate oxides by applying a voltage to unselected rows and columns in an array of EEPROM memory cells. Another technique for limiting the voltages impressed across the gate oxide layers is described below. Those skilled in the art will appreciate that the methods disclosed in the U.S. Pat. No. 6,208,559 are also applicable in the present invention.

To accommodate the substantially uniform oxide layer thickness for the high voltage devices in EEPROM device 10, the present invention includes a charge pumping circuit that limits the voltage impressed across the oxide layers to values below the oxide breakdown field. The charge pumping circuits ensure that the voltage levels impressed across the oxides do not exceed those defined by the reliability limits of the high voltage gate oxides. In general, the charge pump includes voltage regulation so that no device has to handle more than about one-half of the high value programming voltage.

Preferably, the charge pump circuit is a dc-dc converting circuit that provides a voltage that is higher than the voltage of the power supply without the use of amplifiers or transformers. In EEPROM applications, voltages higher than the power supplies are frequently required. For example, a programming voltage of 12 volts may be required, but the available power supply may only be 1.8 volts. Increased voltage levels are obtained in the charge pump as a result of transferring charges to a capacitive load. For that reason, the charge pump circuit is advantageous for applications where the normal range of operating voltages is limited, such as EEPROM.

Figure 8:
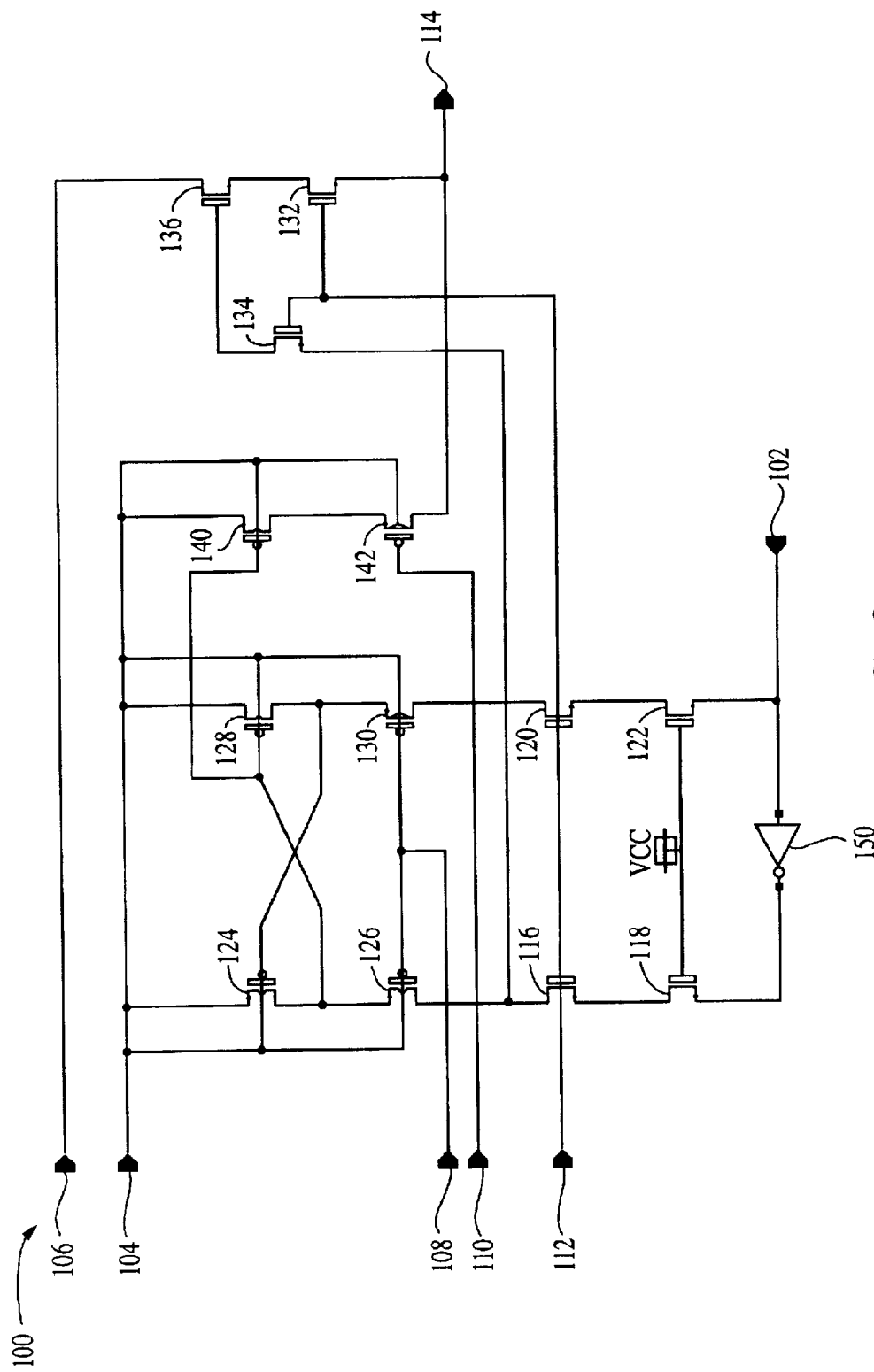
FIGS. 8–15 illustrate schematic circuit diagrams of a charge pumping circuit arranged in accordance with one embodiment of the invention.

A switching circuit 100 is illustrated in FIG. 8. Switching circuit 100 produces a high value programming voltage (the "high PV") at its output 114 when a logic one signal is received at input 102, and a low value programming voltage (the low "PV") when a logic zero signal is received at input 102. In one embodiment the low value is about 0 volts and the high is about 12 volts. In another embodiment, the low PV value is about 4.1 volts and the high PV value is about 12 volts. In yet another embodiment, the low PV value can range from about 0 to about 4.5 volts. The high PV is present at input 104 and the low PV is present at input 106. The voltage applied at input 112 provides the intermediate voltages for cascoded n-channel devices 116, 118, 120, 122, 132, 134, and 136. The signal applied to input 108 (108 may be tied to input 110) provides the intermediate voltages for cascoded p-channel devices 124, 126, 128, 130, 140, and 142. Inverter 150 inverts the signal from input 102 and outputs the inverted signal to device 118.

As used herein, the term "cascoded," as applied to NMOS transistors, means two transistors connected in series, where the voltage on the gate electrode of the second transistor is elevated above that of the first transistor. For PMOS transistor the voltages are reversed. Cascoding the two transistors prevents the drain region of the first transistor from experiencing a voltage greater than elevated voltage on the gate electrode of the second transistor less the threshold voltage of the second transistor.

Switching circuit 100 also includes cascoded circuits. For example, transistors 124 and 128 are cascoded with devices 126 and 130, respectively, to prevent transistors 124 and 128 from being subjected to the entire maximum value of the high PV. Transistors 116 and 120 serve the same purpose as transistors 126 and 130, respectively. Additionally, the drain of transistor 136 is cascoded with the drain of transistor 132 and the gate of transistor 136 is cascoded with the drain of transistor 134 to protect the oxide of transistor 136.

With respect to the transistors in an EEPROM memory array, the circuitry operates, such that during programming the high PV is applied to the gate electrodes and about 11.35 volts is applied to bit line contacts of selected memory cells. For an unselected memory cell, during programming, either the gate electrode or the bit line contact, or both, will be maintained at about 4.1 volts. Accordingly, the high PV is never impressed across a gate oxide layer of any transistor in the memory array.

Figure 9:
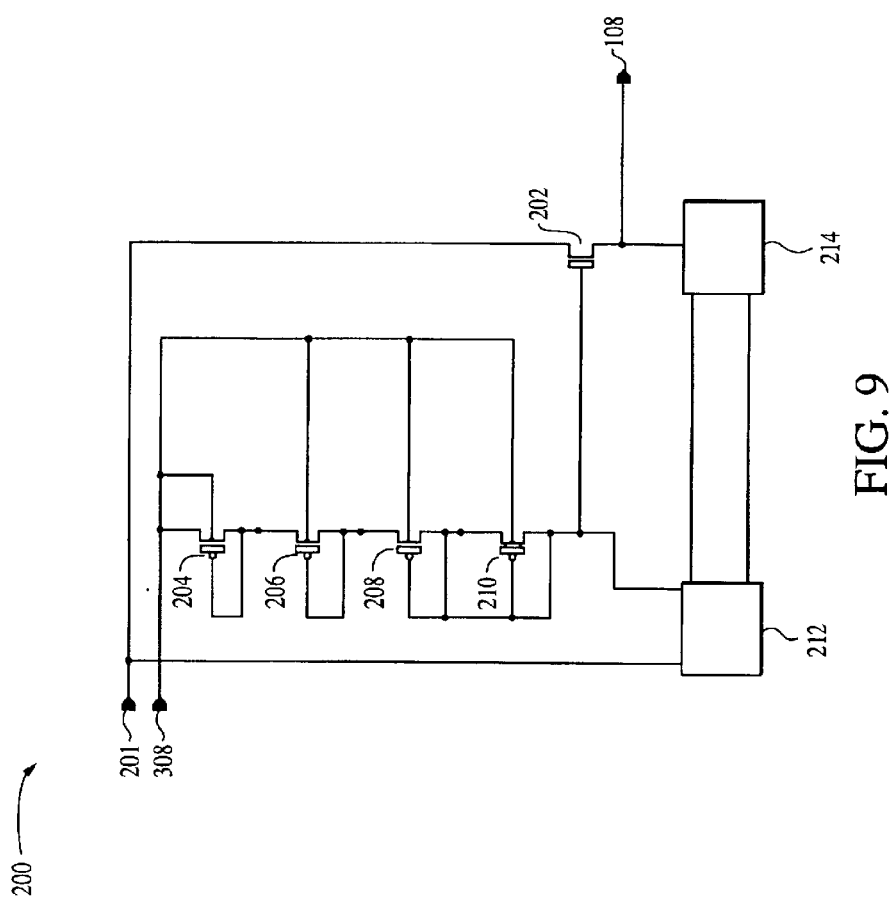

A circuit 200 for producing the input signal at input 108 is shown in FIG. 9. At the beginning of a programming cycle, the input voltage 201 goes to approximately 6 volts. The high PV, is initially set to the voltage available from the on-chip voltage supply ("$V_{cc}$"), then rises to its maximum value over an approximately 2 ms time period. At the beginning of the programming cycle, the signal output at 108 starts at an initial voltage of about 0 volts and rises once the high PV reaches approximately three times the threshold voltage of the transistors 204, 206, 208, and 210. The output signal is clamped at a final voltage, which is less than the high PV, as high PV continues to rise. If the signal at input 102 is a logic one signal, the output of 114 will follow the high PV. If the signal at input 102 is a logic zero signal, the output of 114 will follow the low PV. Circuit 200 also includes a current source 212 to supply current to transistor 210 and a current source 214 to supply current to transistor 202.

Figure 10:
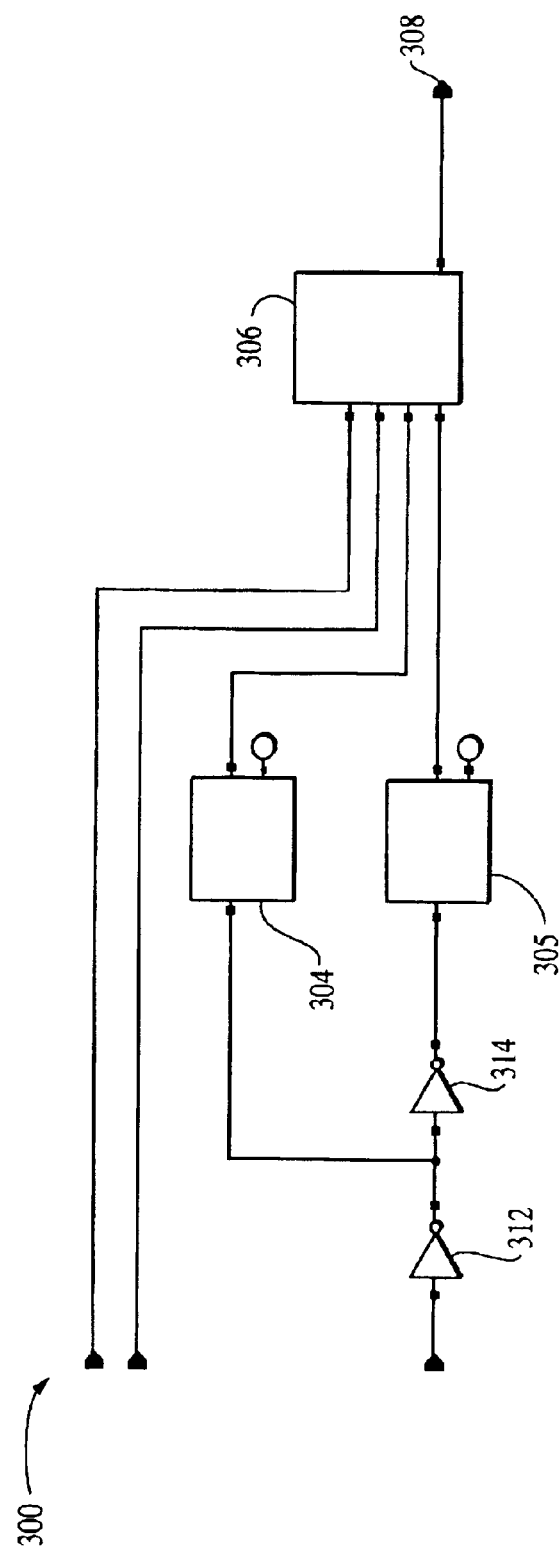

In accordance with the invention, as illustrated in FIG. 10, a charge pump circuit 300 includes a pair of boost circuits 304 and 305, and capacitor/diode pump stack 306. Boost circuits 304 and 305 use the input signal 310 to create a first intermediate oscillating voltage. Capacitor/diode pump stack 306 uses the first intermediate oscillating voltage to create the high PV using a first pump stage, a second pump stage and a diode. The high PV is available at output 308, which is coupled to input 104 of the switching circuit illustrated in FIG. 8. Input 310 to charge pump circuit 300 receives a controlled signal that switches from zero to the EEPROM voltage supply and back again. In one embodiment, the signal switches from zero to 1.8 volts every 40 ns. Inverters 312 and 314 provide signals to boost circuit 304 and boost circuit 305 that are inverse to each other.

Figure 11:
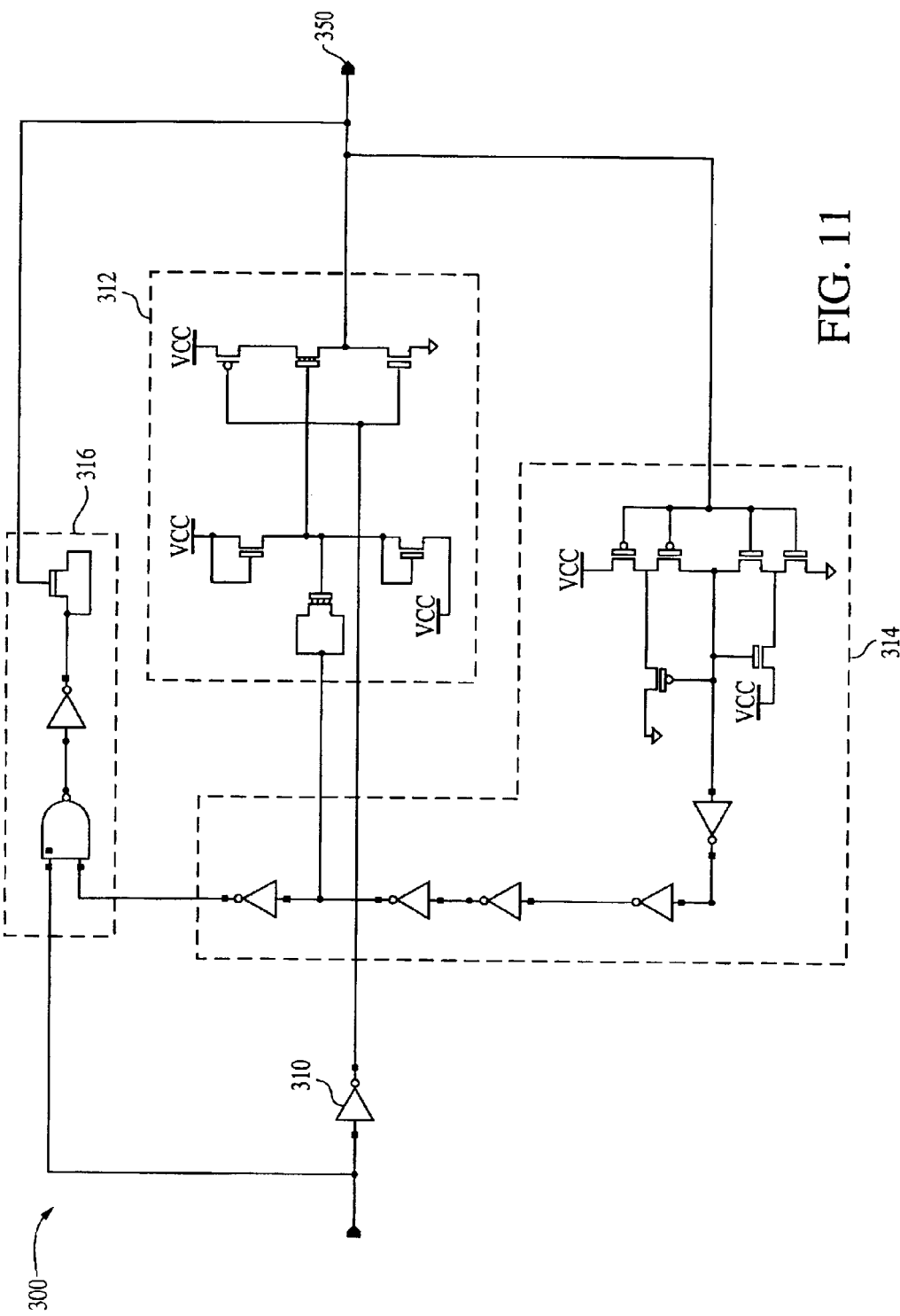

FIG. 11 illustrates boost circuit 305. Boost circuit 305 produces at its output 350 a signal that switches from zero to the first intermediate voltage and back to zero. Boost circuit 305 includes an inverter 310 that provides an inverted signal to initial driver 312. Initial driver 312 pulls output 350 to about voltage Vcc. A level detector 314 detects when output 350 rises to Vcc and provides a signal to driver 312 to release the output.

Level detector 314 also provides a signal to driver 316 to boost output 350. Driver 316 then increases output 350 to the first intermediate voltage level.

Boost circuit 304 is substantially identical to boost circuit 305. Boost circuit 304 will also produce at its output a signal identical to that of boost circuit 305 except it is 180 degrees out of phase with the signal produce by boost circuit 305.

Figure 12:
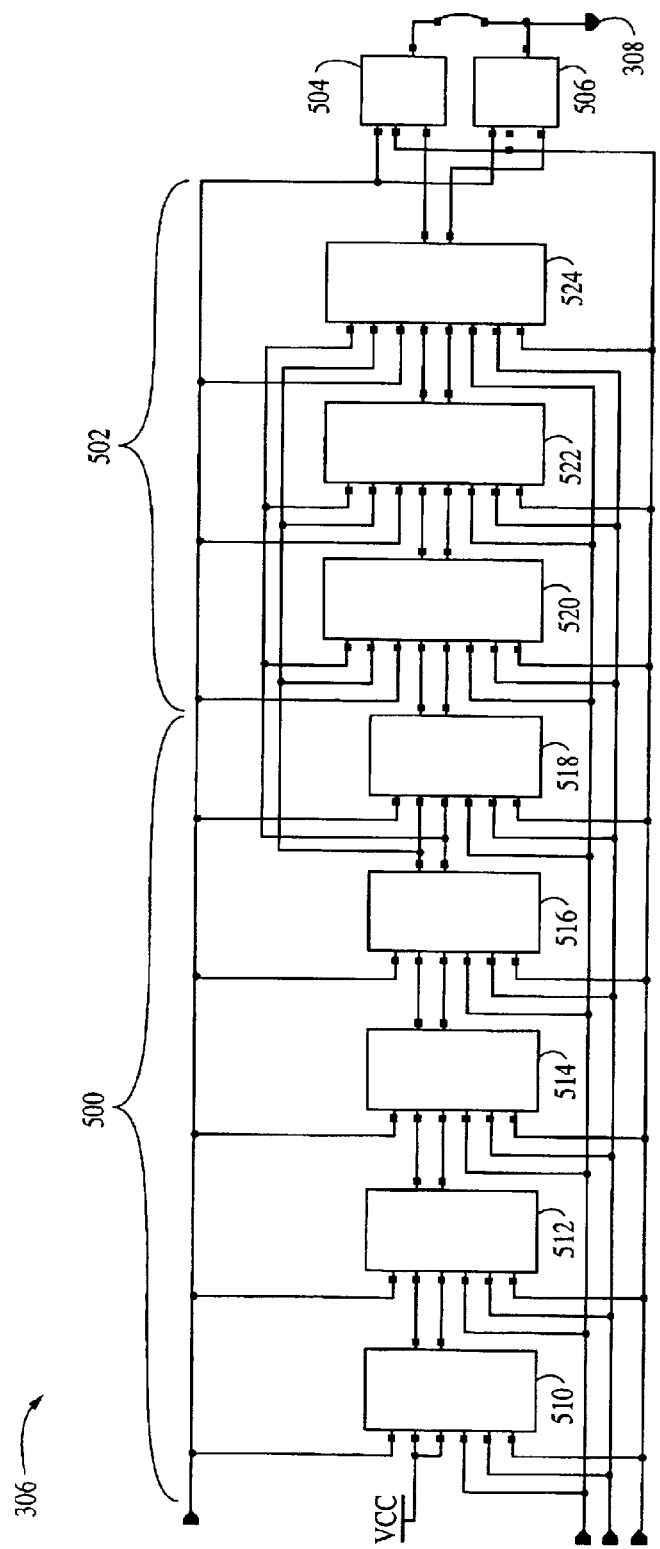

As shown in FIG. 12, capacitor/diode pump stack 306 includes a first pump stage 500, a second pump stage 502, and diode stages 504 and 506. First pump stage 500 includes pumping stacks 510, 512, 514, 516, and 518. First pump stage 500 uses output signals from boost circuits 304 and 305 to create a second intermediate voltage. Second pumping stage 502 includes pumping stacks 520, 522, and 524. Second pumping stage 502 boosts the second intermediate voltage to the high PV. The diode stages 504 and 506 rectify the voltage outputs of pumping stack 524.

The first intermediate oscillating voltage that first stage 500 uses and the second intermediate voltage that it creates do not exceed the voltage that can be sustained by the high voltage gate oxides. The voltage generated by first pumping stage 500 of the capacitor/diode pump stack 306 begins to approach that to which the high voltage gates can be safely subjected. Therefore, cascode circuits, such as those in 504, are used so that no single transistor has the entire high PV across its gate oxide.

Figure 13:
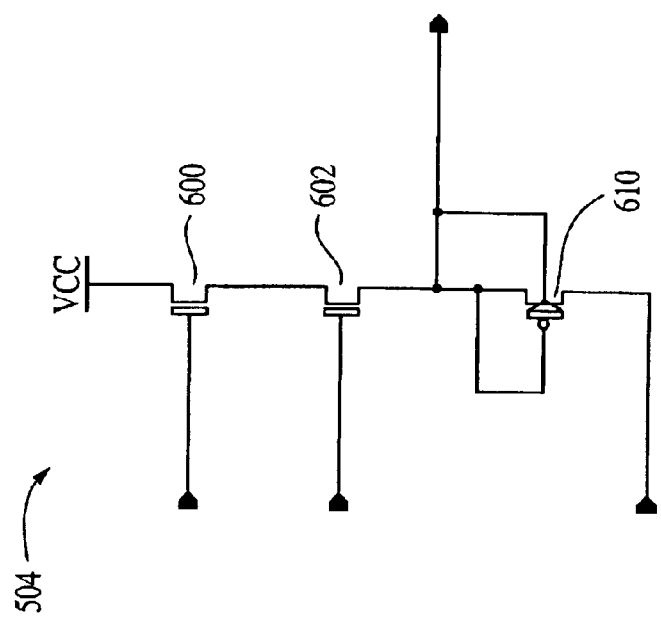

As shown in FIG. 13, for example, cascode circuits of diode stage 504 includes transistors 600 and 602. Transistors 600 and 602 are cascoded to prevent either transistor 600 or transistor 602 from experiencing the entire high PV. Transistor 602 is coupled to a PMOS diode transistor 610.

Figure 14:
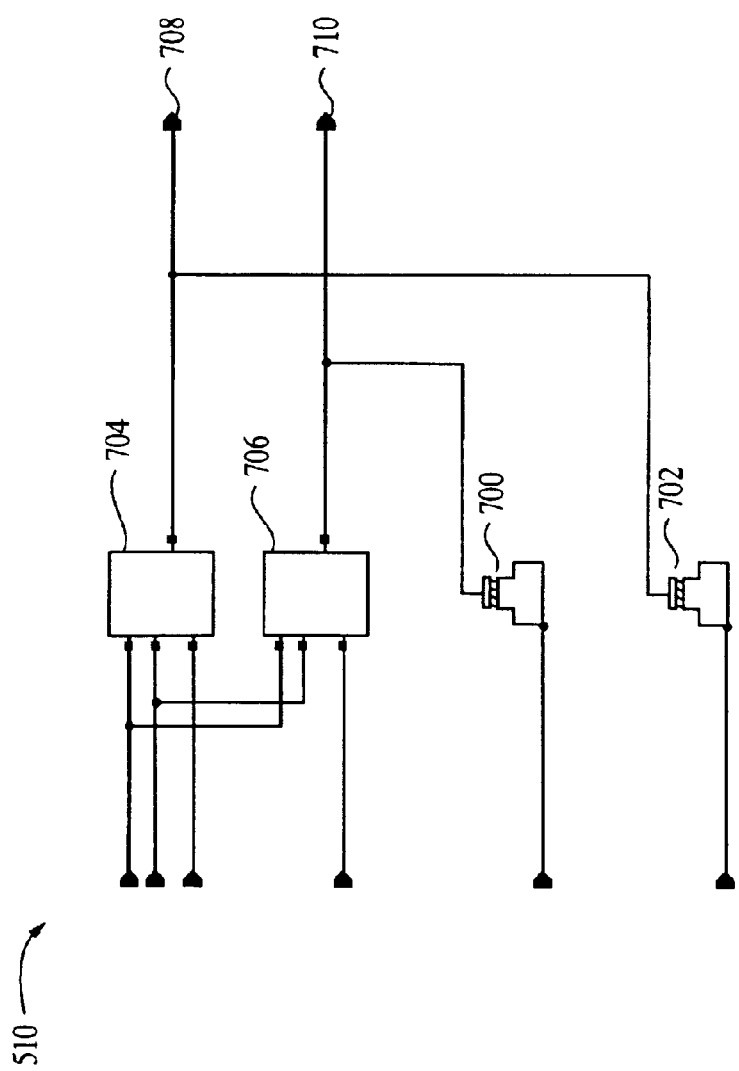

FIG. 14 illustrates one of the pump stacks of first pump stage 500. Pump stack 510 includes a capacitor 700 driven by a diode 706 and a second capacitor 702 driven by a diode 704.

Figure 15:
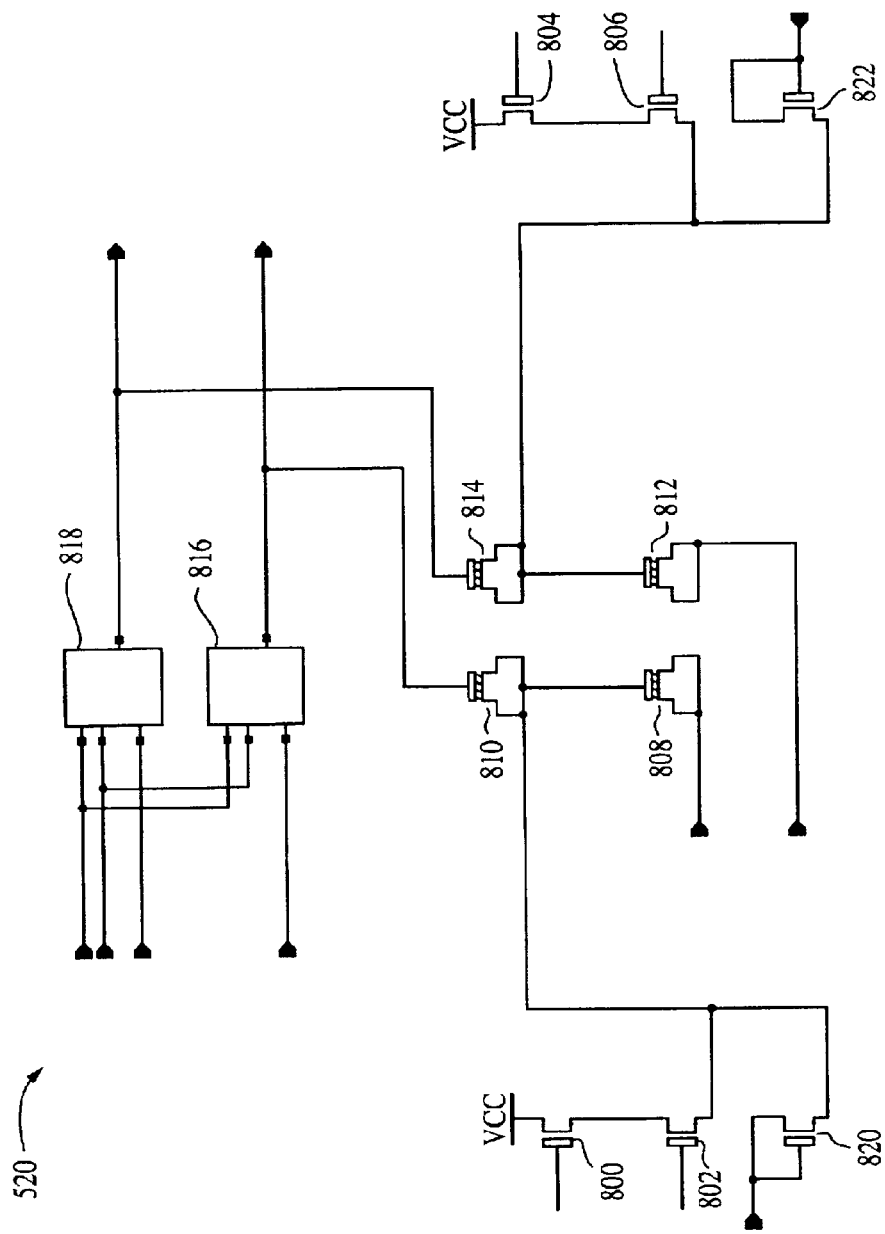

As illustrated in FIG. 15, for example, in the pump stack 520 of the pump stack 306, pumping capacitors 808, 810, 812, and 814 (transistors used as capacitors) used for charge pumps, are connected in series, because otherwise the voltages they would experience exceed the voltage that can be sustained by the high voltage oxides. Pumping capacitor pair 808 and 810 is fed by casoded transistor pair 800 and 802. Further, pumping capacitor pair 812 and 814 is fed by cascoded transistors pair 804 and 806. Cascoded transistor pair 800 and 802 initialize pumping capacitors 808 and 810, and cascoded transistors pair 804 and 806 initialize pumping capacitors 812 and 814. Diodes 816 and 818 drive capacitors 808, 810, 812, and 814. The cascoded transistors, along with transistors 820 and 822, prevent the pumping capacitors from exceeding the maximum gate oxide voltage requirements during long cycle times.

Thus, it is apparent that there has been described, in accordance with the invention, a voltage limited EEPROM device and process for fabricating the device that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, a wide range of charge pump circuitry can be used beyond that illustrated herein. Furthermore, a variety of fabrication techniques, such as electron-cyclotron-resonance (ECR) etching processes, molecular-beam implantation processes, high-capacitance dielectric fabrication processes, and the like, can also be used. It is therefore intended to include within the invention all such variations and modifications as fall within the scope of the appended claims and equivalents thereof.

What is claimed is:

1. A process for fabricating an EEPROM device comprising:
    providing a substrate having a programming region, a tunnel region, a sensing region, and a low voltage region;
    forming a first oxide layer having a first thickness on the programming region, the tunnel region, and the sensing region;
    forming a second oxide layer having a second thickness on the low voltage region,
    wherein the first thickness is greater than the second thickness;
    forming a floating-gate electrode on the first oxide layer and overlying the programming region, the tunnel region, and the sensing region; and
    providing a means for limiting the voltage applied to the programming region to voltage levels below the field breakdown of the first oxide layer, and
    providing a means for limiting the voltage applied to the tunnel region to voltage levels below the field breakdown of the first oxide layer.

2. The process of claim 1, wherein providing a means for limiting the voltage applied to the tunnel region comprises providing a means for applying a voltage of no more than about 8 volts across the first oxide layer overlying the tunnel region.

3. The process of claim 2, wherein providing a means for applying a voltage comprises providing a charge pumping circuit coupled to the EEPROM device.

4. The process of claim 1, wherein providing a means for limiting the voltage applied to the tunnel region comprises providing a means for applying a voltage of less than about 8 volts across the first oxide layer overlying the sensing region.

5. The process of claim 4, wherein providing a means for applying a voltage comprises providing a cascode circuit coupled to the EEPROM device.

6. The process of claim 1, wherein forming a second oxide layer comprises:
   growing an oxide layer on the substrate;
   forming a masking pattern on the oxide layer that exposes the low voltage region;
   etching away the oxide layer using the masking pattern as an etch mask;
   removing the masking pattern; and
   reoxidizing the low voltage region.

7. The process of claim 1, wherein forming the first oxide region comprises:
   forming an initial oxide layer on the programming region, the tunnel region, and the sensing region; and
   oxidizing the substrate to thicken the initial oxide layer.

8. The process of claim 1, further comprising doping the tunnel region and the programming region to a doping concentration of no more than about $1E17$ atoms/cm$^3$ to about $5E19$ atoms/cm$^3$.

9. The process of claim 8, wherein doping comprises ion implantation of an n-type dopant using an implant dose of about $5E13$ ions/cm$^2$ to about $5E15$ ions/cm$^2$.

10. A process for fabricating an EEPROM device comprising:
    providing a substrate having a programming region, a tunnel region, a sensing region, and a low voltage region;
    forming a first oxide layer having a first thickness on the programming region, the tunnel region, and the sensing region;
    forming a second oxide layer having a second thickness on the low voltage region,
    wherein the first thickness is greater than the second thickness;
    forming a floating-gate electrode on the first oxide layer and overlying the programming region, the tunnel region, and the sensing region; and
    using a cascode circuit coupled to the EEPROM device to limit the voltage applied to the tunnel region.

11. The process of claim 10, wherein using a cascode circuit comprises using a charge pumping circuit comprising:
    a pair of boost circuits, wherein the pair of boost circuits boost an input voltage to a first intermediate oscillating voltage; and
    a pumping stack electrically coupled to the pair of boost circuits, wherein the pumping stack boosts the first intermediate oscillating voltage to a programming voltage.

12. A process for fabricating an EEPROM device comprising:
    providing a substrate having a programming region, a sensing region a tunnel region, and a low voltage region;
    doping the programming region, the sensing region, and the tunnel region;
    forming a first oxide layer on the programming region, the sensing region, and the tunnel region, the first oxide layer having substantially the same thickness in the programming region, the sensing region, and the tunnel region;
    forming a second oxide layer having a second thickness on the low voltage region,
    wherein the first thickness is greater than the second thickness;
    forming a floating-gate electrode on the first oxide layer and overlying the programming region, the tunnel region, and the sensing region; and
    wherein the first oxide layer is configured to support a limiting voltage applied by a cascode circuit to the programming region at voltage levels below the field breakdown of the first oxide layer.

13. The process of claim 12, wherein forming a first oxide layer comprises forming an initial oxide layer on the programming region, the tunnel region, and oxidizing the substrate to thicken the initial oxide layer.

* * * * *